(12) United States Patent
Sauciuc et al.

(10) Patent No.: US 7,939,945 B2
(45) Date of Patent: May 10, 2011

(54) ELECTRICALLY CONDUCTIVE FLUID INTERCONNECTS FOR INTEGRATED CIRCUIT DEVICES

(75) Inventors: Ioan Sauciuc, Phoenix, AZ (US); Ward Scott, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 424 days.

(21) Appl. No.: 12/113,024

(22) Filed: Apr. 30, 2008

(65) Prior Publication Data

US 2009/0273083 A1 Nov. 5, 2009

(51) Int. Cl.
*H01L 29/40* (2006.01)
(52) U.S. Cl. .......... 257/774; 257/E21.597; 257/E29.111
(58) Field of Classification Search .................. 257/774, 257/E29.111, E21.597
See application file for complete search history.

(56) References Cited

U.S. PATENT DOCUMENTS

| | | | |
|---|---|---|---|
| 5,001,542 A | 3/1991 | Tsukagoshi et al. | |
| 5,170,930 A | 12/1992 | Dolbear et al. | |
| 5,459,352 A | 10/1995 | Layton et al. | |
| 5,746,927 A | 5/1998 | Hashimoto et al. | |
| 5,779,492 A | 7/1998 | Okuyama et al. | |
| 6,437,240 B2 | 8/2002 | Smith | |
| 6,743,991 B1 | 6/2004 | Wong et al. | |
| 2002/0129894 A1 | 9/2002 | Liu et al. | |
| 2005/0258850 A1 | 11/2005 | Yamada et al. | |
| 2008/0157324 A1* | 7/2008 | Tang et al. ..................... | 257/686 |
| 2008/0191729 A1 | 8/2008 | Blanco et al. | |
| 2009/0001576 A1 | 1/2009 | Tuli et al. | |
| 2009/0020886 A1 | 1/2009 | Yoon | |

FOREIGN PATENT DOCUMENTS

JP 07221421 * 8/1995

* cited by examiner

*Primary Examiner* — Benjamin P Sandvik
*Assistant Examiner* — Krista Soderholm
(74) *Attorney, Agent, or Firm* — Kerry D. Tweet

(57) ABSTRACT

Disclosed are embodiments of an electrically conductive fluid interconnect for coupling an integrated circuit (IC) device to a substrate. The IC device may be coupled to the substrate in a socketless manner or using a socket. The electrically conductive fluid interconnect may include, for example, a metal, an electrically conductive paste, or an electrically conductive polymer material. The fluid may be in a liquid or paste state over at least part of an operating temperature range of the IC device, and in other embodiments the fluid may be in the liquid or paste state at room temperature. Other embodiments are described and claimed.

51 Claims, 5 Drawing Sheets

ELECTRICALLY CONDUCTIVE FLUID INTERCONNECTS FOR INTEGRATED CIRCUIT DEVICES

FIELD OF THE INVENTION

The disclosed embodiments relate generally to integrated circuit devices, and more particularly to the use of an electrically conductive fluid, such as a liquid metal, to electrically couple an integrated circuit device to a substrate.

BACKGROUND OF THE INVENTION

An integrated circuit (IC) die may be disposed on a package to support the die, as well as to aid in forming electrical connections between the die and a next-level component, such as a motherboard or other circuit board. The package typically includes a substrate—sometimes referred to as a "package substrate"—to which the die is both mechanically and electrically coupled. The IC die is coupled to one side of the package substrate (e.g., in a flip-chip arrangement, by a plurality of wirebonds, etc), and a number of electrically conductive terminals are formed on an opposing side of the substrate. The terminals on the opposing side of the package substrate may be used to form electrical connections with the next-level component (e.g., a circuit board), and these electrical connections facilitate the delivery of power to the die and the transmission of input/output (I/O) signals to and from the die. The electrically conductive terminals on the package substrate's opposing side may comprise an array pins, pads, lands, columns, bumps etc., and these terminals may be electrically coupled to a corresponding array of terminals on the circuit board or other next-level component. The terminals on the package substrate's opposing side may be coupled to the next-level board using, for example, a socket (and retention mechanism) or by a solder reflow process.

DETAILED DESCRIPTION OF THE INVENTION

Disclosed are embodiments of electrically conductive fluid interconnects for coupling an integrated circuit (IC) device to another component, such as a circuit board. The disclosed electrically conductive fluid interconnects may be used to form a socketless connection between the IC device and a circuit board. The IC device may include a package substrate having an IC die disposed on one side and terminals for mating with the fluid interconnects on an opposing side. However, in a further embodiment, the fluid interconnects may be disposed on the package substrate (with a mating array of terminals on the circuit board). In yet another embodiment, the disclosed fluid interconnects may be utilized to couple two or more IC devices to opposing sides of a circuit board in a socketless manner. Alternatively, the disclosed fluid interconnects may form part of a socket. In one embodiment, the electrically conductive fluid interconnects include a substance, such as a metal, a metal alloy, or a mixture of a metal with other non-metallic materials, that is in a liquid or paste state over at least part of an operating temperature range of the IC device.

Figure 1A:
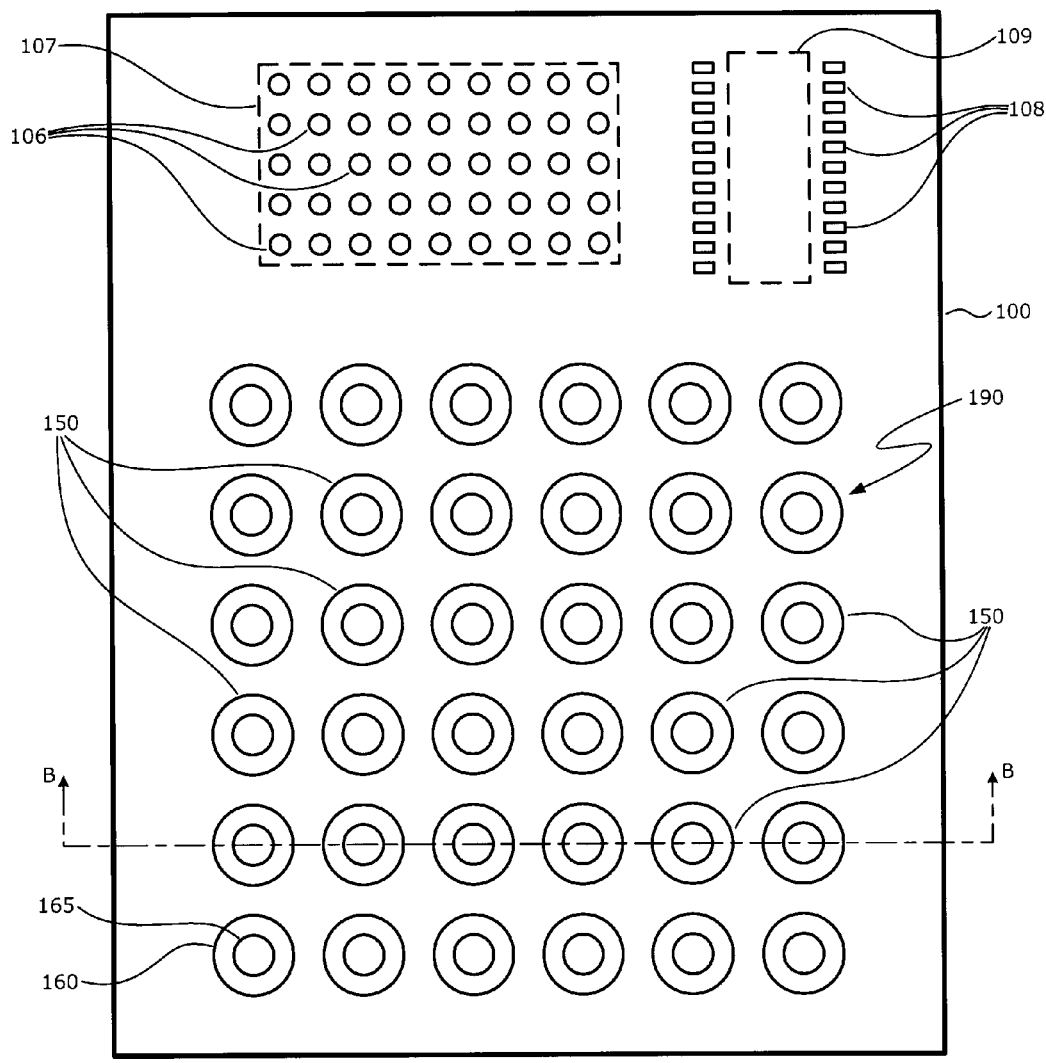
FIG. 1A is a schematic diagram illustrating a plan view of an embodiment of a circuit board including one or more electrically conductive fluid interconnects.
Figure 1B:
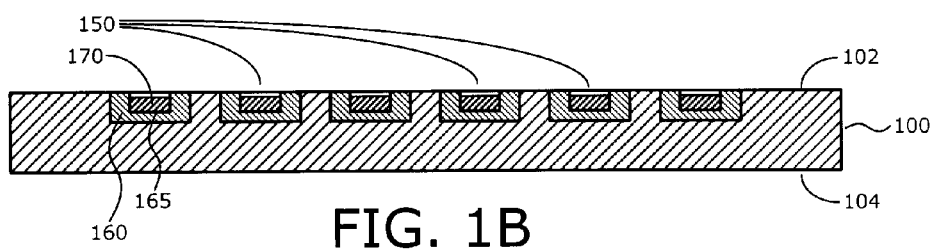
FIG. 1B is a schematic diagram illustrating a side elevation view of the circuit board shown in FIG. 1A, as taken along line B-B of FIG. 1A.

Illustrated in FIGS. 1A and 1B is an embodiment of a circuit board 100 having a number of electrically conductive fluid interconnects 150. The fluid interconnects 150 may be arranged in an array 190 or other pattern corresponding to a mating set of terminals on an IC device that is to be electrically coupled with the circuit board 100 (e.g., see FIG. 2, which will be discussed below). In one embodiment, the IC device that is to be coupled with circuit board 100 comprises a package substrate having an IC die on one side and the mating array of terminals on an opposing side.

Circuit board 100 includes a first side 102 upon which the electrically conductive fluid interconnects 150 are disposed, as well as an opposing second side 104. In one embodiment, the circuit board 100 comprises any substrate capable of providing electrical communication between the components disposed on the board. For example, the circuit board 100 may comprise a multi-layer structure including alternating layers of a dielectric material and a metal (e.g., copper). Further, these dielectric build-up layers may be disposed over a core layer (e.g., a dielectric material or perhaps a metal core), or in another embodiment the circuit board may comprise a coreless substrate. Any one or more of the metal layers may be formed in a desired circuit pattern to route—perhaps in conjunction with other metal layers—electrical signals to and from the devices coupled with the circuit board 100. However, the disclosed embodiments are not limited to the above-described multi-layer circuit board, and it should be understood that the disclosed embodiments may find application to other types of substrates (e.g., ceramics, sapphire, glass, etc.).

In addition to the fluid interconnects 150, the circuit board 100 may include, or be adapted to receive, other components. For example, as shown in FIG. 1A, the circuit board 100 may include a first set of terminals 106 to electrically couple with a device 107 (shown in dashed line) and a second set of terminal 108 to electrically couple with another device 109 (also shown in dashed line). Each of the devices 107, 109 may comprise any desired electrical component, such as an IC device or a passive electrical device (e.g., a capacitor, an inductor, a filter, an antenna, etc., as well as any combination of these and/or other devices). Such passive devices may also be embedded within or otherwise integrated into the circuit board 100. Additional IC devices that may be disposed on circuit board 100 include, by way of example, a graphics device, a wireless communications device, a chipset, a voltage regulator, a memory controller, or a memory (e.g., a flash memory, any type of Dynamic Random Access Memory, etc.), as well as any combination of these and/or other devices.

The circuit board 100 may form part of an assembly that will ultimately be disposed in any type of computing device. For example, the circuit board 100 may be disposed in or form part of a hand-held computing device, a mobile computing device, a wireless communications device, a laptop computer, a desk-top computer, a server, etc.

With continued reference to FIGS. 1A and 1B, each electrically conductive fluid interconnect comprises a metal pad 160 (or other metal structure or electrically conductive terminal) in which a cavity 165 (or other recess) is provided. A quantity of electrically conductive fluid 170 is disposed in the cavity 165. As will be described below in greater detail with respect to FIGS. 2 and 3, the electrically conductive fluid 170 in conjunction with metal pad 160 can form an electrical connection with a terminal extending from an IC device that is to be coupled with the circuit board 100.

Metal pad 160 may comprise any suitable electrically conductive metal, such as copper or aluminum, as well as alloys of these and/or other metals. In another embodiment, the pad 160 may be comprised of a non-metallic substance that is electrically conductive, such as an electrically conductive polymer or a composite material. The pads 160 may each have any suitable shape or configuration, and in one embodiment the pads 160 are generally circular in shape as shown in the figures. However, it should be understood that the pads 160 may have any other suitable shape (e.g., hexagonal, square, rectangular, etc.). Pads 160 may be formed by any suitable fabrication process or combination of processes. In one embodiment, well known (and/or later developed) circuit board fabrication techniques may be used to make circuit board 100 and metal pads 160. The cavity 165 may then be formed using any suitable material removal process, such as a mask and etch process, laser drilling, or mechanical drilling. In an alternative embodiment, the pads 160 and cavities 165 are fabricated at the same time using a build-up process. According to one embodiment, the pads 160 have a thickness of between approximately 5 µm and 100 µm, and a width dimension (e.g., diameter) up to approximately 150 µm.

The cavity 165 of each interconnect 150 may have any suitable shape or configuration capable of at least partially retaining a quantity of an electrically conductive fluid. In one embodiment, the cavity 165 comprises a cylindrical hole, as shown in the figures. It should be understood, however, that cavity 165 may comprise any other suitable shape (e.g., a square-shaped hole, a hemispherical hole, etc.). Also, in one embodiment, the cavities 165 have a depth of between approximately 50 µm and 1 mm, and a width dimension (e.g., diameter) up to approximately 100 µm. Although a function of each cavity 165 is to at least partially hold a quantity of electrically conductive fluid, there may be other factors and/or devices that help in preventing the fluid from escaping an interconnect 150. For example, the effects of surface tension, the freezing temperature of the fluid, the interaction between a mating terminal and the metal pad 160 and/or cavity 165, and a sealing member disposed around an interconnect 150 (as will be described below), as well as other factors, may assist in retaining a fluid in cavity 165. As the reader will appreciate, any combination of the aforementioned factors and/or devices may work together to prevent leakage of fluid from the interconnects 150.

The electrically conductive fluid 170 may comprise any suitable electrically conductive substance. In one embodiment, the fluid 170 comprises a substance that remains in a liquid state or a paste-like consistency over at least a part of the operating temperature range of the IC device to be coupled with interconnects 150. In another embodiment, the electrically conductive fluid 170 is also in a liquid state or a paste-like consistency at room temperature. In a further embodiment, the fluid 170 is in a solid state at room temperature, but melts to a liquid state or a paste during operation of the IC device coupled with interconnects 150.

According to one embodiment, the electrically conductive fluid 170 comprises a liquid metal. Examples of suitable liquid metals include gallium or an alloy of gallium and one or more additional metals (e.g. indium, tin, bismuth, lead, and/or others). According to a further embodiment, the fluid 170 comprises an electrically conductive paste, which may be metallic, non-metallic, or a mixture of metallic and non-metallic substances. For example, the fluid 170 may comprise a mixture of gallium (or a gallium alloy) and a thermal grease. In yet another embodiment, the electrically conductive fluid 170 comprises a non-metallic liquid or paste, such as an electrically conductive polymer or a mixture of a polymer and electrically conductive filler particles.

According to one embodiment, all of the electrically conductive fluid interconnects 150 are substantially the same. However, in other embodiments, some of the fluid interconnects 150 may be different (in shape, size, configuration, material, fluid, pitch/spacing, etc.) than others of the interconnects 150. For example, the fluid interconnects 150 may include a first set for power delivery and a second set for input/output (I/O) signaling, and these two sets of interconnects may be different in one or more respects.

Any suitable methods and/or devices may be used to insert the fluid 170 into the cavities 165 of pads 160. According to one embodiment, the fluid is injected into the cavities one by one using a syringe-like mechanism. According to another embodiment, multiple syringe-like mechanisms may be utilized to inject fluid into a number of the cavities simultaneously. In a further embodiment, a squeegee device may be used to fill the cavities with an electrically conductive fluid. In yet another embodiment, an electrically conductive fluid is dispensed into the cavities as frozen balls (or other appropriate shapes), and subsequently heated (or allowed to warm up) to a temperature at which the fluid changes to a liquid state or paste.

Figure 2:
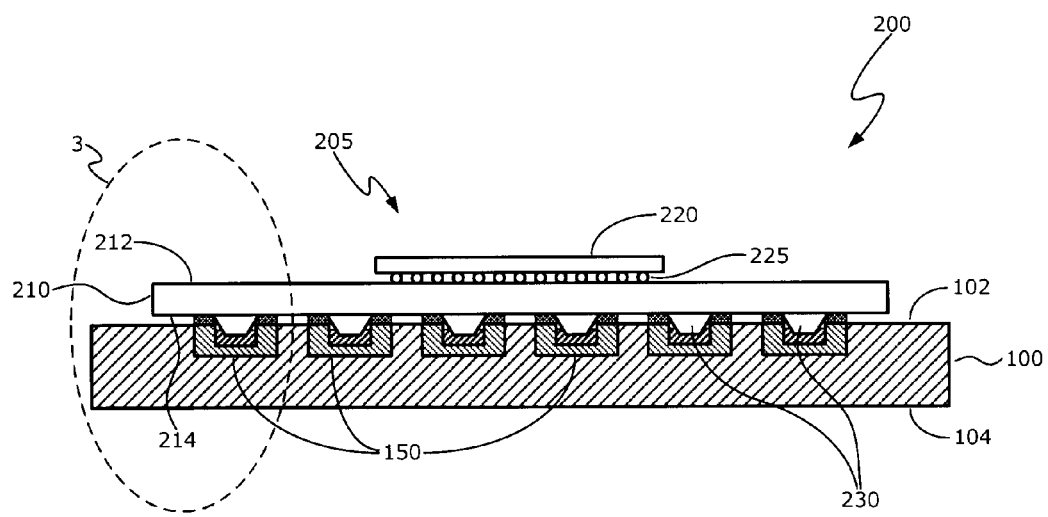
FIG. 2 is a schematic diagram illustrating a side elevation view of an assembly including the circuit board and fluid interconnects of FIG. 1A and 1B.
Figure 3:
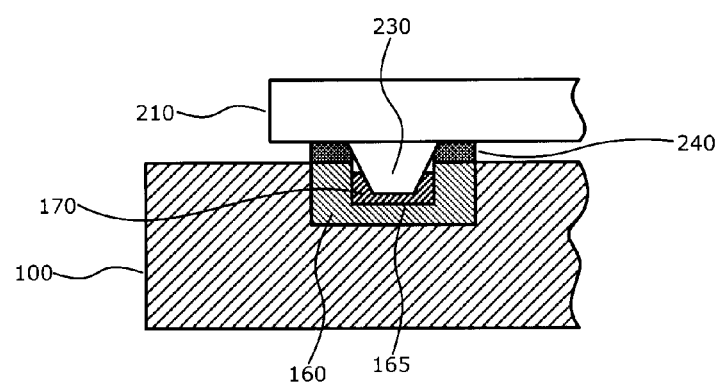
FIG. 3 is a schematic diagram illustrating an enlarged view of a portion of the assembly shown in FIG. 2.

In some embodiments, the electrically conductive fluid 170 may be dispensed onto circuit board 100 at one site, and then shipped to another manufacturing site for further assembly (e.g., attachment of an IC package, as shown in FIGS. 2 and 3). Surface tension may, in some embodiments, assist in retaining the fluid 170 within the interconnects 150 during transfer or shipping between manufacturing sites. In another embodiment, some type of cover or cap (not shown in figures) may be placed over the circuit board 100 to assist in holding the fluid 170 within the cavities 165. Such a cover may be constructed from plastic or any other suitable material. According to yet another embodiment, after dispensing of the fluid 170 into the interconnects 150 on circuit board 100, the board and fluid are cooled in order to freeze the fluid into a solid state for transport. Of course, where the fluid is dispensed in a frozen state, the board and metal may be maintained below the fluid's freezing temperature for shipping. It should be noted that the aforementioned methods for dispensing an electrically conductive fluid and for retaining the fluid within the interconnects during transport may also be applicable to a socket having fluid interconnects (e.g., the socket of FIGS. 4A through 7, which will be described in detail below). Dispensing of a fluid onto the interconnects of such a socket may occur before or after attachment of the socket to an underlying circuit board.

Turning now to FIG. 2, illustrated is an embodiment of an assembly 200. The assembly 200 includes a circuit board 100 having electrically conductive fluid interconnects 150 and a packaged IC device 205. The assembly 200 may comprise, or form part of, any type of computing device. For example, the assembly 200 may comprise, or form part of, a hand-held computing device, a mobile computing device, a wireless communications device, a laptop computer, a desk-top computer, a server, etc.

According to one embodiment, the circuit board 100 comprises that described above with respect to FIGS. 1A and 1B, which includes electrically conductive fluid interconnects 150. However, it should be understood that assembly 200 may include any other type of circuit board (or other board or structure) having fluid interconnects.

In one embodiment, the IC package 205 includes a substrate 210 having a first side 212 and an opposing second side 214, as well as an IC die 220 disposed on the first side 212. The IC die 220 may comprise any suitable processing system (either single core or multi-core), such as a microprocessor, a network processor, a graphics processor, a wireless communications device, a chipset, etc, as well as any combination of these and other systems or devices. In addition to IC die 220, one or more additional die and/or other components may be disposed in package 205. Other components that may be disposed within IC package 205 include a memory (e.g., a flash memory, any type of Dynamic Random Access Memory, etc.), a memory controller, a voltage regulator, as well as passive components (e.g., capacitors, filters, antennas, etc.).

Substrate 210—sometimes referred to as a "package substrate"—may comprise any suitable type of substrate capable of providing electrical communications between the IC die 220 (and perhaps other components, as noted above) and the underlying circuit board 100. The substrate 210 may also provide structural support for the die 220 (and other components). By way of example, in one embodiment, substrate 210 comprises a multi-layer substrate—including alternating layers of a dielectric material and metal—built-up around a core layer (either a dielectric or metal core). In another embodiment, the substrate 210 comprises a core-less multi-layer substrate. Other types of substrates and substrate materials may also find use with the disclosed embodiments (e.g., ceramics, sapphire, glass, etc.).

A number of interconnects 225 may extend between the IC die 220 and substrate 210. The interconnects 225 provide electrical connections between the die 220 and substrate 210, and these interconnects may also aid in mechanically securing the die to the substrate 210. In a further embodiment, a layer of underfill (not shown in figures) may be disposed between the IC die 220 and the substrate 210, and this underfill layer may also assist in securing the die to the substrate. The interconnects 225 may comprise any suitable type of interconnect and may comprise any suitable electrically conductive materials. According to one embodiment, the interconnects 225 comprise an array of solder bumps extending between the die 220 and substrate 210 (perhaps in combination with an array of copper columns extending from die 220 and/or substrate 210). A solder reflow process may be utilized to form the interconnects 225 between the die 220 and substrate 210. Of course, it should be understood that many other types of interconnects and materials are possible (e.g., wirebonds extending between the die 220 and substrate 210).

Further, according to one embodiment, the substrate 210 may comprise alternating layers of dielectric material and metal that are built-up around the die 220 itself, this process sometimes referred to as a "bumpless build-up process." Where such an approach is utilized, the interconnects 225 may not be needed (since the build-up layers may be disposed directly over the die 220).

In one embodiment, the IC package 205 may also include (or be coupled with) a thermal solution (not shown in figures). For example, a lid or heat spreader (sometimes referred to as an integrated heat spreader, or IHS) may be disposed over and thermally coupled with die 220. The heat spreader may comprise any suitable thermally conductive material, such as, for example, copper or a copper alloy. A layer of a thermal interface material (or TIM) may be disposed between the die 220 and the heat spreader. The TIM layer comprises any material capable of thermally coupling (and perhaps mechanically securing) the heat spreader to die 220. Suitable thermal interface materials include, for example, solders and conductive polymers. In a further embodiment, a layer of epoxy or other adhesive may secure the lid or heat spreader to the underlying substrate 210. Also, in yet another embodiment, a heat sink may be thermally coupled to the heat spreader (or, alternatively, a heat sink may be directly thermally coupled with the die, in which case a heat spreader may be omitted).

In addition to IC package 205, one or more additional components may be disposed on the circuit board 100, as suggested above in FIG. 1A. Additional components that may be disposed on circuit board 100 include, for example, a graphics display (e.g., a liquid crystal display, or LCD), passive components (e.g., antennas, capacitors, filters, etc.), a cooling device (e.g., a fan, a heat sink, a heat pipe, etc.), a power supply (e.g., a battery), as well as other IC devices. Additional IC devices that may be disposed on circuit board 100 include, by way of example, a graphics device, a wireless communications device, a chipset, a voltage regulator, a memory controller, or a memory (e.g., a flash memory, any type of Dynamic Random Access Memory, etc.), as well as any combination of these and/or other devices. The assembly 200 may also include a retention mechanism, as will be described in more detail below.

Disposed on the second side 214 of substrate 210 is one or more electrically conductive terminals 230. In one embodiment, each of the terminals 230 comprises any structure capable of forming an electrical connection with a mating one of the fluid interconnects 150 on circuit board 100. According to one embodiment, each terminal comprises a structure extending from the substrate's second side 214 that is adapted to be received in the cavity 165 of mating interconnect 150. For example, a terminal 230 may comprise a truncated cone shape (as shown in figures), a truncated pyramidal shape, a cylindrical shape, a spherical shape or bump, etc. Further, the terminals 230 may comprise any suitable material, including metals, electrically conductive polymers, and composite materials. Suitable metals may include copper, aluminum, gold, silver, as well as alloys of these and/or other metals. Also, according to one embodiment, all of the terminals 230 are substantially the same. However, in other embodiments, some of the terminals 230 may be different (in shape, size, configuration, material, pitch/spacing, etc.) than others of the terminals 230. For example, the terminals 230 may include a first set for power delivery and a second set for I/O signaling, and these two sets of terminals may be different in one or more respects.

Referring now to FIG. 3 in conjunction with FIG. 2, to electrically couple the IC package 205 with circuit board 100, the terminals 230 on package substrate 210 are aligned with the fluid interconnects 150 on board 100, and then the terminals 230 are inserted into the cavities 165 on the pads 160 (best seen in FIG. 3, which shows an enlarged view of the portion of assembly 200 denoted by reference numeral 3 in FIG. 2). Electrical connections are then formed between the terminals 230 and the electrically conductive fluid interconnects 150. In one embodiment, each terminal 230 forms contact with at least the fluid 170 in the mating interconnect 150, but perhaps no physical contact is formed with the pad 160 and/or cavity 165 of the mating interconnect. In another embodiment, some or all of the terminals 230 also form physical and electrical contact with at least a part of metal pad 160 and/or cavity 165 of their mating interconnect. Because an electrical connection can be formed between a terminal 230 and a fluid interconnect 150 without physical contact between a terminal 230 and it's mating pad 160 and/or cavity 165, the fluid interconnects can compensate for non-planarities (e.g., that caused by warpage, differential thermal expansion, etc.) of the substrate 210 and/or circuit board 100, as well as misalignment between these two components. A further potential advantage provided by the disclosed electrically conductive fluid interconnects may be the elimination of a solder reflow process to form interconnects between a packaged IC and a circuit board (while also eliminating any conflict between the reflow temperature of the solder interconnects and the reflow temperature of a solder thermal interface material).

According to one embodiment, to assist in retaining the electrically conductive fluid 170 within interconnects 150, a sealing element 240 may be disposed between the substrate 210 and circuit board 100. In one embodiment, a sealing element 240 comprises compliant material that will at least partially compress when disposed between substrate 210 and board 100. For example, a sealing element 240 may comprises a polymer material, such as a rubber, a sponge-like rubber, etc. According to one embodiment, each sealing element 240 may form contact with the substrate 210, the circuit board 100, the pad 160 and/or cavity 165, and with a terminal 230, as well as with any combination of these structures. Also, as shown in FIGS. 2 and 3, a number of individual sealing elements 240 may be utilized, each sealing element (e.g., a washer-like structure) surrounding one fluid interconnect 150 and mating terminal 230. However, in another embodiment, rather than a plurality of separate sealing elements, a single sheet-like sealing element may be used, this sheet-like sealing element having a number of apertures corresponding to the fluid interconnects and mating terminals. It should be noted that the sealing elements 240 (or single sheet-like sealing element) may also help to compensate for the above-described non-planarities.

To hold the IC package 205 on circuit board 100—and maintain the electrical connections between the terminals 230 and fluid interconnects 150—the assembly 200 may further include a retention mechanism (not shown in figures). Traditional retention mechanisms used with conventional sockets typically exert a high force on the IC package in order to maintain electrical connections in the face of warpage, differential thermal expansion, etc. In order to exert such a high force, these retention mechanism may include a backing plate (disposed on the lower side of the circuit board). However, for the assembly 200 (as well as the embodiments discussed below), a retention mechanism providing a relatively low pressure may be utilized, because the fluid interconnects will assist in maintaining electrical connections in the presence of warpage, differential thermal expansion, misalignment, as well as other failure modes. The use of fluid interconnects 150 disposed directly on circuit board 100 (eliminating a socket) in combination with the aforementioned low pressure retention mechanism (which may not require a backing plate) may reduce the overall height of assembly 200.

Figure 4A:
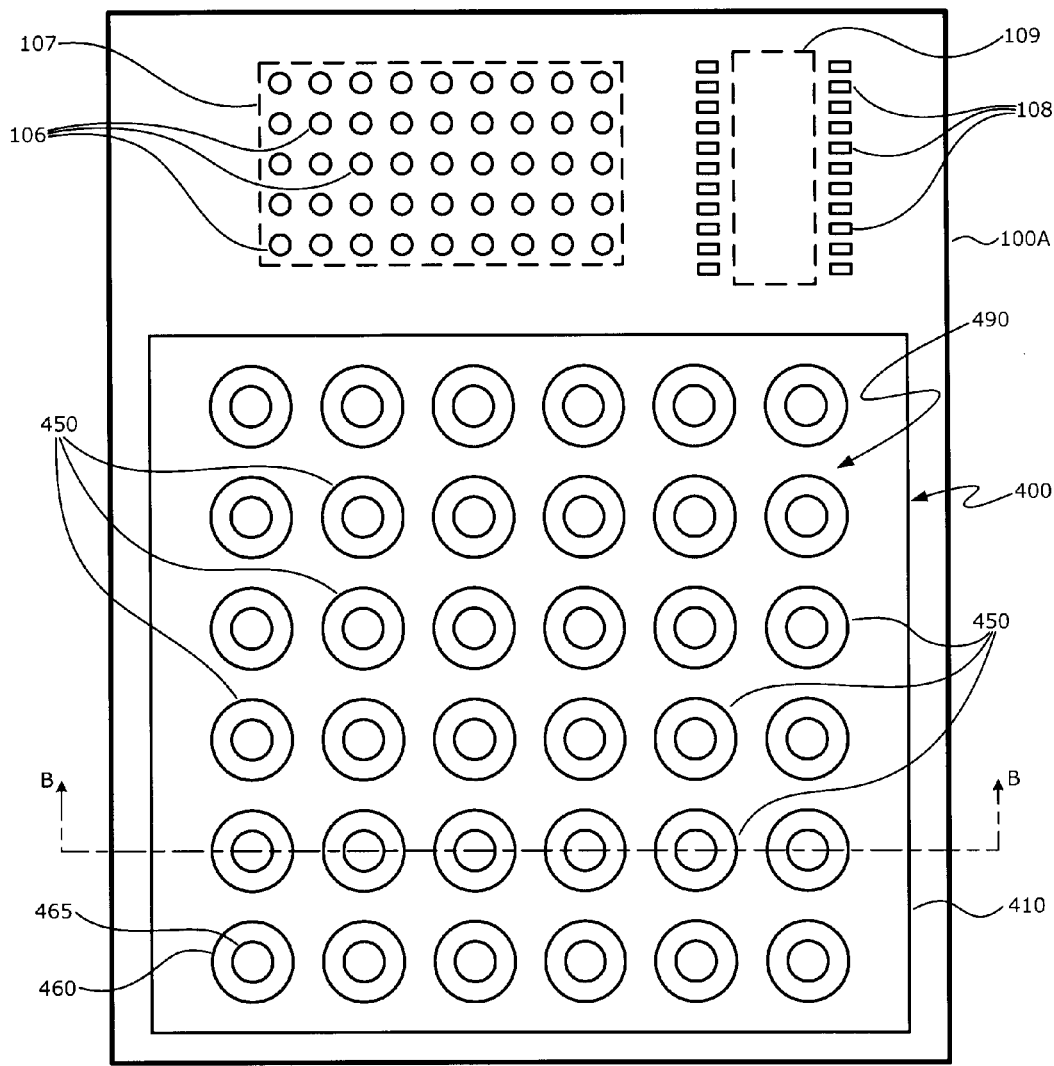
FIG. 4A is a schematic diagram illustrating a plan view of an embodiment of a circuit board having a socket including one or more electrically conductive fluid interconnects.
Figure 4B:
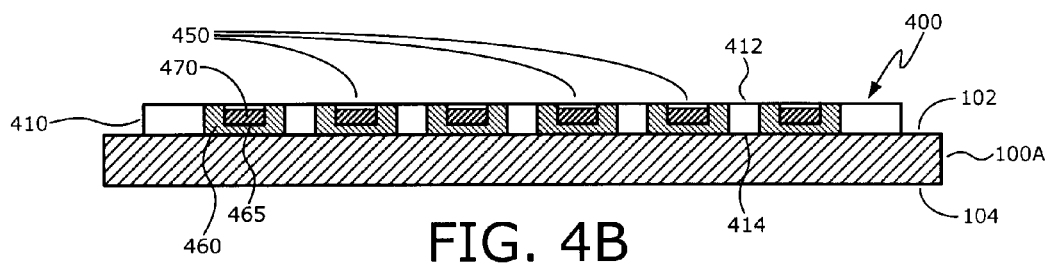
FIG. 4B is a schematic diagram illustrating a side elevation view of the circuit board and socket shown in FIG. 4A, as taken along line B-B of FIG. 4A.

With reference to FIGS. 4A and 4B, illustrated is an embodiment of a socket 400 having a number of electrically conductive fluid interconnects 450. The socket 400 is disposed on a circuit board 100A. The fluid interconnects 450 may be arranged in an array 490 or other pattern corresponding to a mating set of terminals on a IC device that is to be electrically coupled with the socket 400 and, hence, with the circuit board 100A (e.g., see FIG. 5, which will be discussed below). According to one embodiment, the socket 400 having fluid interconnects 450 may be disposed on a conventional circuit board, thereby enabling the use of the disclosed fluid interconnects on a standard circuit board without modification (or with minimal changes) to the board.

The circuit board 100A and socket 400 may form part of an assembly that will ultimately be disposed in any type of computing device. For example, the circuit board 100A with socket 400 may be disposed in or form part of a hand-held computing device, a mobile computing device, a wireless communications device, a laptop computer, a desk-top computer, a server, etc.

Circuit board 100A may be similar to circuit board 100 described above with respect to FIGS. 1A through 3. However, rather than having fluid interconnects, the circuit board 100A includes a number of electrically conductive terminals (not shown in figures) disposed on the upper surface 102, and these terminals will be used to couple the board 100A with the socket 400. The electrically conductive terminals on board 100A may comprise any suitable structures (e.g., lands, pads, etc.) and be formed from any suitable electrically conductive materials (e.g., copper, aluminum, as well as alloys of these and/or other metals). The socket 400 may be electrically (and perhaps mechanically) coupled to the circuit board by, for example, a solder reflow process, mechanical fasteners, a retention mechanism, or any other suitable method or device.

At this juncture, it should be noted that reference numerals used to identify certain features of circuit board 100 shown in FIGS. 1A through 3 are retained in FIGS. 4A though 7 for like elements of circuit board 100A. Further, descriptions of like elements previously described in the discussion of FIGS. 1A through 3 may not be repeated in the text below.

The socket 400 comprises a base 410 (or other supporting frame or body) having a first surface 412 and an opposing second surface 414. Second surface 414 faces the upper surface 102 of circuit board 100A. Disposed within and supported by the base 410 are the electrically conductive fluid interconnects 450. The socket base 410 may be constructed from any suitable materials (e.g., plastics, ceramics, composites, etc.) and may be fabricated by any suitable method or combination of methods (e.g., molding, laminating, machining, etc.). According to one embodiment, the socket base 410 comprises a single- or multi-layer substrate that is fabricated using well know (and/or later developed) circuit board fabrication techniques. In one embodiment, the socket base 410 may have a thickness of between approximately 200 µm and 2 mm.

Each fluid interconnect 450 comprises a metal pad 460 (or other metal structure or electrically conductive terminal) in which a cavity 465 (or other recess) is provided. A quantity of an electrically conductive fluid 470 is disposed in the cavity 465. As will be described below in greater detail with respect to FIGS. 5 and 6, the fluid 470 in conjunction with a metal pad 460 can form an electrical connection with a terminal extending from an IC device that is to be coupled with the socket

400. The fluid interconnects 450 may be similar to fluid interconnects 150 described above, and further descriptions of some like aspects of fluid interconnects 450 may not be repeated below.

As was the case for interconnects 150, in one embodiment, all of the fluid interconnects 450 are substantially the same. However, in other embodiments, some of the fluid interconnects 450 may be different (in shape, size, configuration, material, fluid, pitch/spacing, etc.) than others of the interconnects 450. For example, the fluid interconnects 450 may include a first set for power delivery and a second set for I/O signaling, and these two sets of interconnects may be different in one or more respects.

Figure 5:
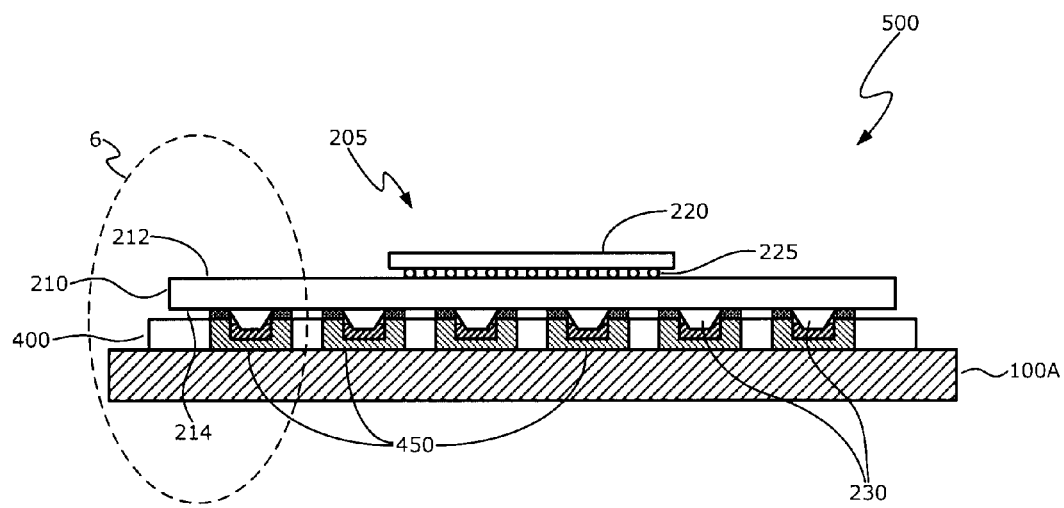
FIG. 5 is a schematic diagram illustrating a side elevation view of an assembly including the socket and fluid interconnects of FIGS. 4A and 4B.

Turning now to FIG. 5, illustrated is an embodiment of an assembly 500. The assembly 500 includes a circuit board 100A on which a socket 400 has been disposed. The socket 400 includes electrically conductive fluid interconnects 450, and a packaged IC device 205 has been coupled with the socket 400. The assembly 500 may comprise, or form part of, any type of computing device. For example, the assembly 500 may comprise, or form part of, a hand-held computing device, a mobile computing device, a wireless communications device, a laptop computer, a desk-top computer, a server, etc.

According to one embodiment, the circuit board 100A and socket 400 having fluid interconnects 450 comprise that described above with respect to FIGS. 4A and 4B. However, it should be understood that assembly 500 may include any other types of circuit board (or other board or structure) and socket (or similar structure) having fluid interconnects. Further, according to one embodiment, the IC package 205 comprises that described with respect to FIGS. 2 and 3 and the accompanying text above, and a description of the IC package 205 is not repeated below. However, it should be understood that assembly 500 may include other types of integrated circuit devices.

Figure 6:
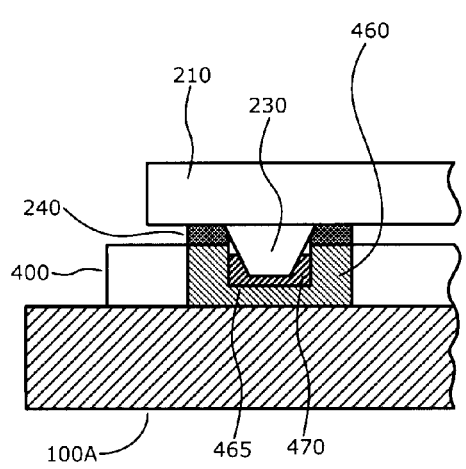
FIG. 6 is a schematic diagram illustrating an enlarged view of a portion of the assembly shown in FIG. 5.

Referring now to FIG. 6 in conjunction with FIG. 5, to electrically couple the IC package 205 with the socket 400 (and, hence, circuit board 100A), the terminals 230 of IC package 205 are aligned with the fluid interconnects 450 on socket 400, and then the terminals 230 are inserted into the cavities 465 on the pads 460 (best seen in FIG. 6, which shows an enlarged view of the portion of assembly 500 denoted by reference numeral 6 in FIG. 5). Electrical connections are then formed between the terminals 230 and the fluid interconnects 450. In one embodiment, each terminal 230 forms contact with at least the electrically conductive fluid 470 in the mating interconnect 450, but perhaps no physical contact is formed with the pad 460 and/or cavity 465 of the mating interconnect. In another embodiment, some or all of the terminals 230 also form physical and electrical contact with at least a part of metal pad 460 and/or cavity 465 of their mating interconnect. Because an electrical connection can be formed between a terminal 230 and a fluid interconnect 450 without physical contact between a terminal 230 and it's mating pad 460 and/or cavity 465, the fluid interconnects can compensate for non-planarities (e.g., that caused by warpage, differential thermal expansion, etc.) of the substrate 210, socket base 410, and/or circuit board 100A, as well as misalignment between any of these components.

Figure 7:
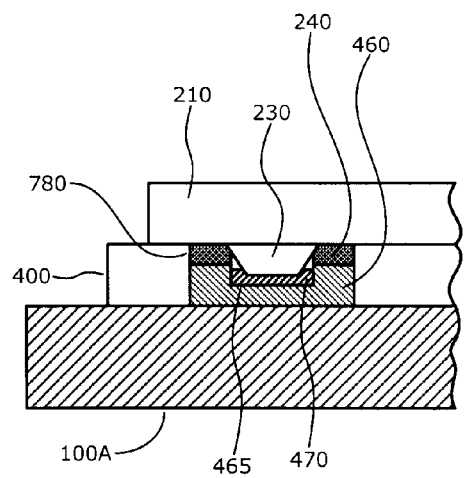
FIG. 7 is a schematic diagram illustrating an enlarged view of a portion of an alternative embodiment of the assembly shown in FIG. 5.

According to one embodiment, to assist in retaining the electrically conductive fluid 470 within interconnects 450, a sealing element 240 may be disposed between the substrate 210 and socket base 410 (see FIG. 6). The sealing element 240 (whether a plurality of discrete elements or a single sheet-like element) may be similar to that previously described, and a further description of some aspects of sealing element 240 is not repeated below. According to another embodiment, as shown in FIG. 7, the sealing element 240 may be disposed in a recess 780 formed in socket base 410, and the lower surface 214 of substrate 210 abuts against (or lies close too) the upper surface 412 of socket base 410. It should be noted that the embodiment of FIG. 7 may also be applied to the socket-less embodiment described above with respect to FIG. 1A through 3.

To hold the IC package 205 on socket 400 (and circuit board 100A), as well as to maintain the electrical connections between the terminals 230 and fluid interconnects 450, the assembly 500 may further include a retention mechanism (not shown in figures). As noted above, traditional retention mechanisms used with conventional sockets typically exert a high force on the IC package in order to maintain electrical connections in the face of warpage, differential thermal expansion, etc. In order to exert such a high force, these retention mechanism may include a backing plate (disposed on the lower side of the circuit board). However, for the assembly 500, a retention mechanism providing a relatively low pressure may be utilized, because the fluid interconnects will assist in maintaining electrical connections in the presence of warpage, differential thermal expansion, misalignment, as well as other failure modes. The use of fluid interconnects 450 disposed on socket 400 in combination with the aforementioned low pressure retention mechanism (which may not require a backing plate) may reduce the overall height of assembly 500 as compared to traditional socket assemblies.

Figure 8:
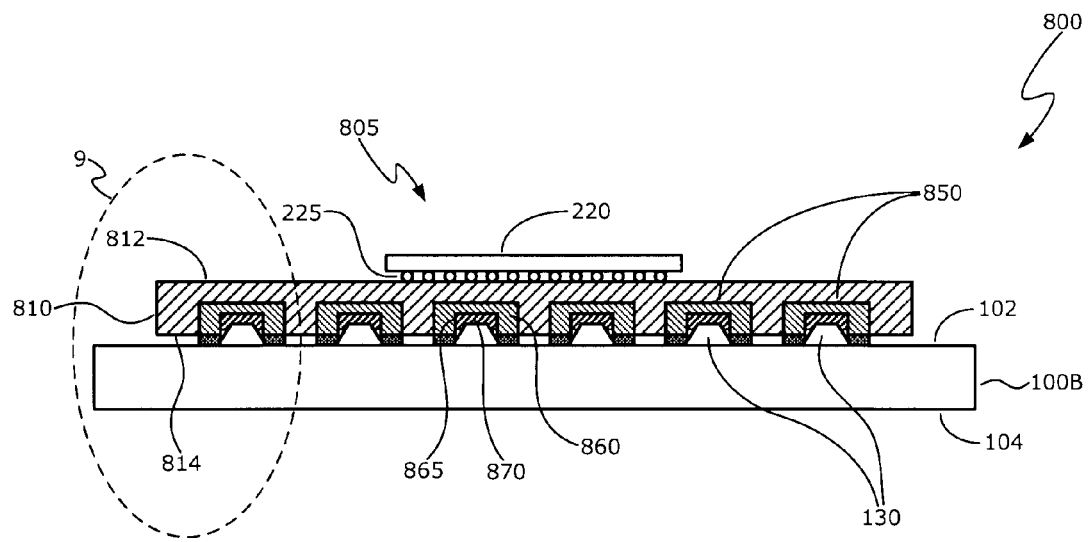
FIG. 8 is a schematic diagram illustrating a side elevation view of an embodiment of an assembly having an IC package including electrically conductive fluid interconnects.
Figure 9:
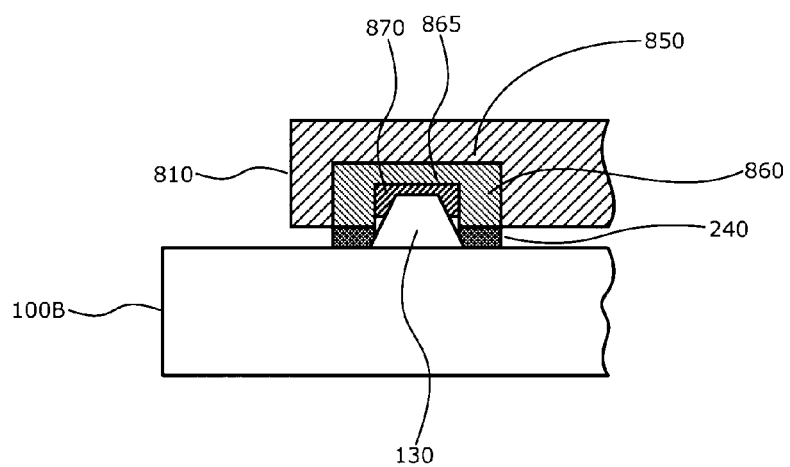
FIG. 9 is a schematic diagram illustrating an enlarged view of a portion of the assembly shown in FIG. 8.

Referring now to FIGS. 8 and 9, illustrated is an embodiment of an assembly 800. The assembly 800 includes an IC package 805 having a number of electrically conductive fluid interconnects 850. The IC package 805 is disposed on a circuit board 100B, which has an array of terminals 130 to form electrical connections with the fluid interconnects 850. The assembly 800 may comprise, or form part of, any type of computing device. By way of example, the assembly 800 may comprise, or form part of, a hand-held computing device, a mobile computing device, a wireless communications device, a laptop computer, a desk-top computer, a server, etc.

At this juncture, it should be noted that reference numerals used to identify certain features of circuit board 100 and assembly 200 shown in FIGS. 1A through 3, as well as circuit board 100A and assembly 400 of FIGS. 4A through 7, are retained in FIGS. 8 and 9 for like elements of circuit board 100B and/or assembly 800. Further, descriptions of like elements previously described in the discussions of FIGS. 1A through 7 may not be repeated in the text below.

Circuit board 100B may be similar to circuit boards 100A or 100 described above with respect to FIGS. 1A through 3 and FIGS. 4A through 7. However, rather than having fluid interconnects, the circuit board 100B includes a number of electrically conductive terminals 130 disposed on the upper surface 102, and these terminals will be used to couple the board 100B with IC package 805. In one embodiment, each of the terminals 130 comprises any structure capable of forming an electrical connection with a mating one of the fluid interconnects 850 on IC package 805. For example, a terminal 130 may comprise a truncated cone shape (as shown in figures), a truncated pyramidal shape, a cylindrical shape, a spherical shape or bump, etc. Further, the terminals 130 may comprise any suitable material, including metals, electrically conductive polymers, and composite materials. Suitable metals may include copper, aluminum, gold, silver, as well as alloys of these and/or other metals. Also, according to one embodiment, all of the terminals 130 are substantially the same. However, in other embodiments, some of the terminals 130 may be different (in shape, size, configuration, material, pitch/spacing, etc.) than others of the terminals 130. For example, the terminals 130 may include a first set for power delivery and a second set for I/O signaling, and these two sets of terminals may be different in one or more respects.

In one embodiment, the IC package 805 includes a substrate 810 having a first side 812 and an opposing second side 814, as well as an IC die 220 disposed on the first side 812. A number of interconnects 225 extend between the IC die 220 and package substrate 810, and an underfill layer may be disposed between the die 220 and substrate 810 (see previous discussion of die 220 and interconnects 225). The package substrate 810 may, in some respects, be similar to the substrate 210 described above, and may comprise any suitable substrate (e.g., a multi-layer substrate built up over a core layer, a multi-layer coreless substrate, a bumpless build-up layer substrate, etc.) capable of providing electrical communications between IC die 220 and the underlying circuit board 100B (see discussion above regarding substrate 210). However, the substrate 810 includes a number of fluid interconnects 850 disposed on the second side 814.

Each fluid interconnect 850 comprises a metal pad 860 (or other metal structure or electrically conductive terminal) in which a cavity 865 (or other recess) is provided. A quantity of an electrically conductive fluid 870 is disposed in the cavity 865. As will be described below in greater detail, the fluid 870 in conjunction with a metal pad 860 can form an electrical connection with the terminals 130 extending from circuit board 100B. The fluid interconnects 850 may be similar to fluid interconnects 150 and 450 described above, and further descriptions of some like aspects of fluid interconnects 850 may not be repeated below.

As was the case for interconnects 150 and 450, in one embodiment, all of the electrically conductive fluid interconnects 850 are substantially the same. However, in other embodiments, some of the fluid interconnects 850 may be different (in shape, size, configuration, material, fluid, pitch/spacing, etc.) than others of the interconnects 850. For example, the fluid interconnects 850 may include a first set for power delivery and a second set for I/O signaling, and these two sets of interconnects may be different in one or more respects.

In addition to IC package 805, one or more additional components may be disposed on the circuit board 100B. Additional components that may be disposed on circuit board 100B include, for example, a graphics display (e.g., a liquid crystal display, or LCD), passive components (e.g., antennas, capacitors, filters, etc.), a cooling device (e.g., a fan, a heat sink, a heat pipe, etc.), a power supply (e.g., a battery), as well as other IC devices. Additional IC devices that may be disposed on circuit board 100B include, by way of example, a graphics device, a wireless communications device, a chipset, a voltage regulator, a memory controller, or a memory (e.g., a flash memory, any type of Dynamic Random Access Memory, etc.), as well as any combination of these and/or other devices. The assembly 800 may also include a retention mechanism (e.g., a relatively low pressure retention mechanism), as previously described. In addition, according to one embodiment, the IC package (and/or assembly 800) may include a thermal solution, as described above.

Referring now to FIG. 9 in conjunction with FIG. 8, to electrically couple the IC package 805 with the circuit board 100B, the fluid interconnects 850 of IC package 805 are aligned with the terminals 130 on circuit board 100B, and then the terminals 130 are inserted into the cavities 865 on the pads 860 (best seen in FIG. 9, which shows an enlarged view of the portion of assembly 800 denoted by reference numeral 9 in FIG. 8). Electrical connections are then formed between the terminals 130 and the fluid interconnects 850. In one embodiment, each terminal 130 forms contact with at least the electrically conductive fluid 870 in the mating interconnect 850, but perhaps no physical contact is formed with the pad 860 and/or cavity 865 of the mating interconnect. In another embodiment, some or all of the terminals 130 also form physical and electrical contact with at least a part of metal pad 860 and/or cavity 865 of their mating interconnect. Because an electrical connection can be formed between a terminal 130 and a fluid interconnect 850 without physical contact between a terminal 130 and it's mating pad 860 and/or cavity 865, the fluid interconnects can compensate for non-planarities (e.g., that caused by warpage, differential thermal expansion, etc.) of the substrate 810 and/or circuit board 100B, as well as misalignment between any of these components.

According to one embodiment, to assist in retaining the electrically conductive fluid 870 within interconnects 850, a sealing element 240 may be disposed between the substrate 810 and circuit board 100B (see FIG. 9). The sealing element 240 (whether a plurality of discrete elements or a single sheet-like element) may be similar to that previously described, and a further description of some aspects of sealing element 240 is not repeated below. According to another embodiment, the sealing element 240 may be disposed in a recess (e.g., see FIG. 7 and the accompanying text above) formed in package substrate 810, and the lower surface 814 of substrate 810 abuts against (or lies close too) the upper surface 102 of circuit board 100B.

In the aforementioned embodiments, a single IC package has been coupled to a circuit board by the disclosed electrically conductive fluid interconnects. However, it should be understood that multiple IC devices may be coupled to a circuit board using fluid interconnects. For example, two or more IC devices may be coupled to one side of a circuit board using fluid interconnects, in either a socketless or socket configuration, and with the fluid interconnects disposed on either the circuit board or the IC devices. By way of further example, one IC package may be disposed on one side of a circuit board using fluid interconnects in a socketless manner, and a second IC package may be disposed on an opposing side of the circuit board using fluid interconnects in a socketless manner, with the fluid interconnects being disposed on either the circuit board and/or the IC packages. Further, the disclosed fluid interconnects may be utilized to form electrical connections between packages in a package-on-package configuration.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:
1. An apparatus comprising:
a first substrate, the first substrate including a number of interconnects, each of the interconnects including an electrically conductive fluid;
a second substrate, the second substrate including number of terminals, each terminal electrically coupled with one of the interconnects;

at least one sealing element surrounding one of the interconnects, the at least one sealing element disposed between the first and second substrates; and an integrated circuit (IC) die disposed on the first substrate or on the second substrate.

2. The apparatus of claim 1, wherein the electrically conductive fluid is in a liquid or paste state over at least part of an operating temperature range of the IC die.

3. The apparatus of claim 1, wherein the electrically conductive fluid is in a liquid or paste state at room temperature.

4. The apparatus of claim 1, wherein the first substrate comprises a circuit board and the second substrate comprises a package substrate, the IC die disposed on the second substrate.

5. The apparatus of claim 1, wherein the first substrate comprises a socket base and the second substrate comprises a package substrate, the IC die disposed on the second substrate.

6. The apparatus of claim 1, wherein the first substrate comprises a package substrate, the IC die disposed on the first substrate, and wherein the second substrate comprises a circuit board.

7. The apparatus of claim 1, wherein the electrically conductive fluid comprises a metal.

8. The apparatus of claim 7, wherein the metal comprises one or more metals selected from a group consisting of gallium, indium, tin, bismuth, and lead.

9. The apparatus of claim 1, wherein the electrically conductive fluid comprises a conductive paste.

10. The apparatus of claim 9, wherein the conductive paste comprises a mixture including gallium and a thermal grease.

11. The apparatus of claim 1, therein the electrically conductive fluid comprises a polymer.

12. The apparatus of claim 1, wherein each interconnect comprises an electrically conductive pad disposed on the first substrate and a cavity formed in the pad, wherein a quantity of the electrically conductive fluid is disposed in the cavity.

13. A method of forming electrical connections between a first substrate and a second substrate, wherein an integrated circuit (IC) die is disposed on the first substrate or on the second substrate, the method comprising electrically coupling an interconnect on the first substrate with a terminal on the second substrate using an electrically conductive fluid disposed in the interconnect, and surrounding the interconnect with a sealing element disposed between the first and second substrates to retain the electrically conductive fluid.

14. The method of claim 13, wherein the electrically conductive fluid is in a liquid or paste state over at least part of an operating temperature range of the IC die.

15. The method of claim 13, wherein the electrically conductive fluid is in a liquid or paste state at room temperature.

16. The method of claim 13, wherein the first substrate comprises a circuit board and the second substrate comprises a package substrate, the IC die disposed on the second substrate.

17. The method of claim 13, wherein the first substrate comprises a socket base and the second substrate comprises a package substrate, the IC die disposed on the second substrate.

18. The apparatus of claim 13, wherein the first substrate comprises a package substrate, the IC die disposed on the first substrate, and wherein the second substrate comprises a circuit board.

19. The method of claim 13, wherein the electrically conductive fluid comprises a metal.

20. The method of claim 19, wherein the metal comprises one or more metals selected from a group consisting of gallium, indium, tin, bismuth, and lead.

21. The method of claim 13, wherein the electrically conductive fluid comprises a conductive paste.

22. The method of claim 21, wherein the conductive paste comprises a mixture including gallium and a thermal grease.

23. The method of claim 13, wherein the electrically conductive fluid comprises a polymer.

24. A package, comprising:
a substrate having a first side and an opposing second side;
an integrated circuit (IC) die disposed on the first side of the substrate;
a number of interconnects disposed on the second side of the substrate, the interconnects arranged to mate with a number of terminals on a circuit board, each of the interconnects including an electrically conductive fluid; and
at least one sealing element surrounding one of the interconnects, the at least one sealing element disposed adjacent the second side of the substrate.

25. The package of claim 24, wherein the electrically conductive fluid is in a liquid or paste state over at least part of an operating temperature range of the IC die.

26. The package of claim 24, wherein the electrically conductive fluid is in a liquid or paste state at room temperature.

27. The package of claim 24, wherein the electrically conductive fluid comprises a substance selected from a group consisting of metals, electrically conductive pastes, and polymers.

28. The package of claim 24, wherein each interconnect comprises an electrically conductive pad disposed on the substrate and a cavity formed in the pad, wherein a quantity of the electrically conductive fluid is disposed in the cavity.

29. A socket, comprising:
a base having a first side and an opposing second side;
a number of interconnects disposed on the first side of the base, the interconnects arranged to mate with number of terminals on an integrated circuit (IC) device, each of the interconnects including an electrically conductive fluid;
a number of terminals disposed on the second side of the base, the terminals arranged to made with a number of terminals on a circuit board; and
at least one sealing element surrounding one of the interconnects, the at least one sealing element disposed adjacent the first side of the base.

30. The socket of claim 29, wherein the electrically conductive fluid is in a liquid or paste state over at least part of an operating temperature range of the IC die.

31. The socket of claim 29, wherein the electrically conductive fluid is in a liquid or paste state at room temperature.

32. The socket of claim 29, wherein the electrically conductive fluid comprises a substance selected from a group consisting of metals, electrically conductive pastes, and polymers.

33. The socket of claim 29, wherein each interconnect comprises an electrically conductive pad disposed on the base and a cavity formed in the pad, wherein a quantity of the electrically conductive fluid is disposed in the cavity.

34. The apparatus of claim 1, wherein the at least one sealing element comprises a sheet of material surrounding two or more of the interconnects, the sheet having a plurality of apertures corresponding to the interconnects.

35. The apparatus of claim 1, wherein the at least one sealing element comprises a compliant material that is at least partially compressed between the first and second substrates.

36. The method of claim 13, wherein the sealing element comprises a compliant material, the method further comprising at least partially compressing the sealing element between the first and second substrates.

37. The package of claim 24, wherein the at least one sealing element comprises a sheet of material surrounding two or more of the interconnects, the sheet having two or more apertures corresponding to the interconnects.

38. The package of claim 24, wherein the at least one sealing element comprises a compliant material.

39. The socket of claim 29, wherein the at least one sealing element comprises a sheet of material surrounding two or more of the interconnects, the sheet having two or more apertures corresponding to the interconnects.

40. The socket of claim 29, wherein the at least one sealing element comprises a compliant material.

41. An apparatus comprising:
  a first substrate, the first substrate including a number of interconnects, each of the interconnects including an electrically conductive fluid, the electrically conductive fluid comprised of a polymer;
  a second substrate, the second substrate including number of terminals, each terminal electrically coupled with one of the interconnects; and
  an integrated circuit (IC) die disposed on the first substrate or on the second substrate.

42. The apparatus of claim 41, wherein the electrically conductive fluid is in a liquid or paste state over at least part of an operating temperature range of the IC die.

43. The apparatus of claim 41, wherein the electrically conductive fluid is in a liquid or paste state at room temperature.

44. The apparatus of claim 41, wherein the first substrate comprises a circuit board and the second substrate comprises a package substrate, the IC die disposed on the second substrate.

45. The apparatus of claim 41, wherein the first substrate comprises a socket base and the second substrate comprises a package substrate, the IC die disposed on the second substrate.

46. The apparatus of claim 1, wherein the first substrate comprises a package substrate, the IC die disposed on the first substrate, and wherein the second substrate comprises a circuit board.

47. The apparatus of claim 41, wherein the electrically conductive fluid comprises a mixture of the polymer and electrically conductive filler particles.

48. The apparatus of claim 41, wherein each interconnect comprises an electrically conductive pad disposed on the first substrate and a cavity formed in the pad, wherein a quantity of the electrically conductive fluid is disposed in the cavity.

49. The apparatus of claim 41, further comprising at least one sealing element surrounding one of the interconnects, the at least one sealing element disposed between the first and second substrates.

50. The apparatus of claim 49, wherein the at least one sealing element comprises a sheet of material surrounding two or more of the interconnects, the sheet having two or more apertures corresponding to the interconnects.

51. The apparatus of claim 49, wherein the at least one sealing element comprises a compliant material that is at least partially compressed between the first and second substrates.

* * * * *